United States Patent
Shah

(10) Patent No.: US 10,488,898 B2
(45) Date of Patent: Nov. 26, 2019

(54) FLEXIBLE HEAT SPREADER

(71) Applicant: Microsoft Technology Licensing, LLC, Redmond, WA (US)

(72) Inventor: Ketan R. Shah, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/476,590

(22) Filed: Mar. 31, 2017

(65) Prior Publication Data

US 2018/0284856 A1    Oct. 4, 2018

(51) Int. Cl.
| | |
|---|---|
| *G06F 1/20* | (2006.01) |
| *G06F 1/16* | (2006.01) |
| *H05K 7/20* | (2006.01) |
| *H01L 23/34* | (2006.01) |

(52) U.S. Cl.
CPC ............ *G06F 1/203* (2013.01); *G06F 1/1616* (2013.01); *G06F 1/1637* (2013.01); *G06F 1/1681* (2013.01); *G06F 1/206* (2013.01); *H01L 23/34* (2013.01); *H05K 7/2039* (2013.01)

(58) Field of Classification Search
CPC .... G06F 2200/201; G06F 1/20; G06F 1/1616; G06F 1/206; G06F 2200/203; G06F 1/1681; G06F 2200/202; H05K 7/20436; H05K 13/04; H05K 1/0203; H05K 7/20;

(Continued)

(56) References Cited

U.S. PATENT DOCUMENTS

| | | | |
|---|---|---|---|
| 4,958,260 A | * 9/1990 | Kobayashi | ........... H05K 1/0284 361/748 |
| 5,757,615 A | * 5/1998 | Donahoe | ................. G06F 1/203 165/104.33 |
| 5,946,187 A | 8/1999 | Cipolla | |

(Continued)

OTHER PUBLICATIONS

Smalc, et al., "Thermal Performance of Natural Graphite Heat Spreaders", In Proceedings of ASME Pacific Rim Technical Conference and Exhibition on Integration and Packaging of MEMS, NEMS, and Electronic Systems collocated with the ASME Heat Transfer Summer Conference, Jul. 17, 2005, pp. 1-11.

(Continued)

*Primary Examiner* — James Wu
*Assistant Examiner* — Michael A Matey
(74) *Attorney, Agent, or Firm* — Ray Quinney & Nebeker P.C.; John O. Carpenter

(57) ABSTRACT

Thermal management devices for a computing device are described herein. A thermal management device includes a layer of a first material included in a dynamic portion of the thermal management device and a static portion of the thermal management device. The dynamic portion of the thermal management device is bendable relative to the static portion of the thermal management device when the thermal management device is physically connected to a display and a chassis of the computing device, and the display rotates relative to a chassis. The layer of material has a first side and a second side. The second side is opposite the first side. The thermal management device also includes a first layer of a second material and a second layer of the second material physically connected to the first side and the second side of the static portion of the layer of the first material, respectively.

19 Claims, 5 Drawing Sheets

(58) Field of Classification Search
CPC .. H05K 7/2039; H05K 1/148; H05K 2201/05; H05K 7/20963
See application file for complete search history.

(56) References Cited

U.S. PATENT DOCUMENTS

| | | | | |
|---|---|---|---|---|
| 6,052,280 | A * | 4/2000 | Dilley | G06F 1/203 |
| | | | | 165/104.33 |
| 6,075,696 | A * | 6/2000 | Progl | G06F 1/203 |
| | | | | 16/226 |
| 6,324,055 | B1 * | 11/2001 | Kawabe | G06F 1/1616 |
| | | | | 361/679.54 |
| 6,772,479 | B2 * | 8/2004 | Hinkley | E05D 1/02 |
| | | | | 16/225 |
| 7,417,863 | B2 * | 8/2008 | Park | H05K 7/20445 |
| | | | | 165/80.2 |
| 7,746,631 | B2 * | 6/2010 | Ali | G06F 1/1616 |
| | | | | 165/104.33 |
| 2004/0060687 | A1 | 4/2004 | Moss, II | |
| 2005/0243528 | A1 * | 11/2005 | Murayama | H05K 1/148 |
| | | | | 361/760 |
| 2006/0086493 | A1 | 4/2006 | Fujiwara et al. | |
| 2006/0092666 | A1 | 5/2006 | Jeong et al. | |
| 2007/0286556 | A1 * | 12/2007 | Kassamakov | G06F 1/1616 |
| | | | | 385/88 |
| 2008/0130221 | A1 * | 6/2008 | Varadarajan | G06F 1/203 |
| | | | | 361/679.52 |
| 2009/0323276 | A1 * | 12/2009 | Mongia | G06F 1/203 |
| | | | | 361/679.52 |
| 2011/0090631 | A1 | 4/2011 | Atkinson | |
| 2011/0110047 | A1 * | 5/2011 | Pauley | H05K 1/0203 |
| | | | | 361/715 |
| 2012/0087094 | A1 | 4/2012 | Hill et al. | |
| 2014/0098489 | A1 * | 4/2014 | Chiriac | G06F 1/203 |
| | | | | 361/679.54 |
| 2015/0092332 | A1 | 4/2015 | Yu et al. | |
| 2016/0007497 | A1 | 1/2016 | North et al. | |

OTHER PUBLICATIONS

Bengtsson, Annika, "Design of Graphite Heat Spreaders for Avionics", In Master of Science Thesis of KTH Industrial Engineering and Management, Jun. 12, 2009, 99 pages.

"International Search Report and Written Opinion Issued in PCT Application No. PCT/US18/024231", dated Jul. 5, 2018, 15 Pages.

* cited by examiner

FLEXIBLE HEAT SPREADER

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
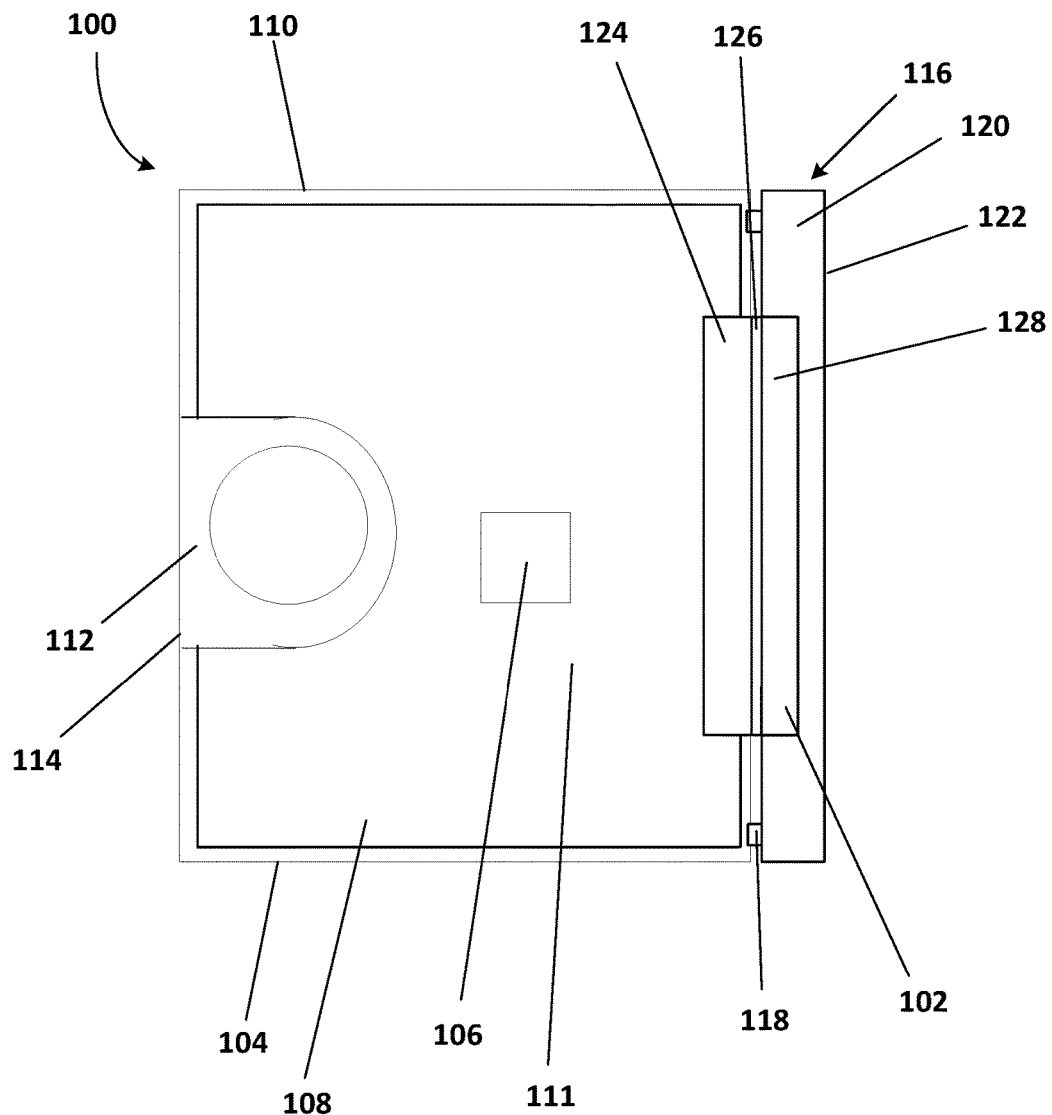
FIG. 1 depicts a top view of a computing device including a flexible heat spreader with a top removed.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range (e.g., below a maximum user touch temperature). During operation, electronic devices dissipate power as heat that is to be removed from the device. Otherwise, the electronic device will get hotter and hotter until the electronic device is unable to perform efficiently. When overheating, electronic devices run slowly and dissipate power poorly. This can lead to eventual device failure and reduced service life.

As computing devices get smaller (e.g., thinner), thermal management becomes more of an issue. Heat may be dissipated from a computing device using forced and natural convection, conduction, and radiation as a way of cooling the computing device as a whole and a processor operating within the computing device. For a laptop computing device, for example, most of the power is dissipated in a base (e.g., a chassis) of the computing device, as the motherboard, which may include a central processing unit (CPU), memory, and storage (e.g., SSD storage), is located in the base. The display of the laptop computing device remains relatively cool, as less power is dissipated in the display compared to the base, and little heat is transferred from the base to the display via, for example, conduction. Other than hinges that rotatably attach the display to the base, the base-display interface is open without solid connection to allow for the rotation of the display relative to the base.

Disclosed herein is a flexible heat spreader in a computing device to transfer heat out of the base of the computing device to the display of the computing device. The flexible heat spreader includes a dynamic portion and at least one static portion. For example, the dynamic portion extends between two static portions that are physically attached to the base and the display, respectively. The dynamic portion of the heat spreader may extend through the hinge of the computing device.

A layer of graphite, for example, extends across the dynamic portion and the two static portions of the heat spreader. The layer of graphite may be thin (e.g., as thin as 10 μm) to provide flexibility during display rotation (e.g., opening and closing). Additional layers of graphite, for example, are physically connected (e.g., adhered) to opposite sides of the layer of graphite within the two static portions of the heat spreader, respectively. The additional layers of graphite make the static portions of the heat spreader thicker than the dynamic portion of the heat spreader, which improves conductive heat transfer from the base to the display. The heat generated in the motherboard, for example, is conducted into (e.g., via one of the additional layers of graphite) and through the layer of graphite extending across the dynamic portion and the two static portions of the heat spreader, and into the display (e.g., via another one of the additional layers of graphite).

The flexible heat spreader improves heat dissipation from the base of the computing device compared to computing devices without such a heat spreader extending between the base and the display of the computing device, thus decreasing a maximum skin temperature at the base. A maximum skin temperature at the display of the computing device increases but remains within a skin temperature limit. Accordingly, a processor within the base (e.g., the CPU) may operate at a higher processing speed for a longer period of time compared to computing devices without such a heat spreader extending between the base and the display of the computing device.

As an example, a thermal management device for a computing device includes a layer of a first material included in a dynamic portion of the thermal management device and a static portion of the thermal management device. The dynamic portion of the thermal management device is bendable relative to the static portion of the thermal management device when the thermal management device is physically connected to a display and a chassis of the computing device, and the display rotates relative to the chassis. The layer of the first material has a first side and a second side. The second side is opposite the first side. The thermal management device also includes a first layer of a second material and a second layer of the second material physically connected to the first side and the second side of the static portion of the layer of the first material, respectively.

Such heat dissipation apparatuses and systems have several potential end-uses or applications, including any electronic device to be cooled. For example, the heat dissipation apparatus may be incorporated into personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, the electronic device may be operated at a higher power for a longer period of time, fans may be operated at a lower speed, or any combination thereof may be provided when compared to a similar electronic device without one or more of the improved heat dissipation features. In other words, the heat dissipation features described herein may provide improved thermal management for an electronic device such as a mobile phone, tablet computer, or laptop computer.

FIG. 1 depicts a top view of a computing device 100 including a flexible heat spreader 102 with a top surface removed. The computing device 100 may be any number of computing devices including, for example, a personal computer, a tablet or other handheld computing device, a laptop or mobile computer, a communications device such as a mobile phone, a multiprocessor system, a microprocessor-based system, a programmable consumer electronic device, a minicomputer, a mainframe computer, or an audio and/or video media player.

The computing device 100 includes a housing 104 (e.g., a chassis) that at least partially supports at least the flexible heat spreader 102 and one or more heat generating components 106. The housing 104 includes a top (not shown), a bottom 108, and at least one side 110 extending between the top and the bottom 108 of the housing 104. The housing 104 may be made of any number of materials including, for example, plastic or metal (e.g., aluminum).

The one or more heat generating components 106 may be any number of electrically powered devices including, for example, a processor, a graphics card, memory, a power supply, a hard drive, or another electrically powered device. The one or more heat generating components 106 may be supported by the housing 104 via, for example, a printed circuit board (PCB) 111 (e.g., the motherboard) attached to and/or supported by the housing 104. The one or more heat generating components 106 are in communication with each other and/or other electrical devices or components (e.g., fans) of the computing device 100 via the PCB 111, for example. The computing device 100 may include a number of components not shown in FIG. 1 (e.g., a hard drive, a power supply, connectors).

One heat generating component 106 is shown in the example of FIG. 1. More heat generating components 106 may be included in the computing device 100. In one example, the heat generating component 106 is a processor. In other examples, the heat generating component 106 represents a different component within the computing device 100 (e.g., a hard drive, a power supply, or another processor).

In the example shown in FIG. 1, the computing device 100 includes one or more fans 112 (e.g., a fan) to actively cool the one or more heat generating components 106. The one or more fans 112 pull cooling air into the computing device 100 via vents through the housing 104 or inlet/outlets 114 of the one or more fans 112 and move heat out of the computing device 100 via the inlet/outlets 114 of the one or more fans 112 or the vents through the housing 104. The one or more fans 112 are in communication with at least one of the heat generating components 106 and/or another heat generating component. The one or more fans 112 may be any number of different types of fans including, for example, an axial-flow fan, a centrifugal fan, a crossflow fan, or another type of fan. The one or more fans 112 may be sized and may rotate at a speed based on the heat generating component 106 to be cooled (e.g., based on the heat generated by the heat generating component 106 to be cooled). Each of the one or more fans 112 may be the same type of fan, or different types of fans may be used. While the example of FIG. 1 shows a single fan 112, the computing device 100 may include more fans.

A display 116, only a portion of which is shown in FIG. 1, is rotatably attached to the housing 104 via one or more hinges 118 (e.g., two hinges). In the example shown in FIG. 1, a front of the display 116 is removed, and an inner surface 120 of a display cover 122 is shown. The display cover 122 may be made of any number of materials including, for example, a metal (e.g., aluminum).

The flexible heat spreader 102 may be one or more layers of a thermally conductive material. In one example, the flexible heat spreader 102 is a flexible phase change device such as, for example, a heat pipe or a vapor chamber. The flexible heat spreader 102 includes a first portion 124 (e.g., a first static portion), a second portion 126 (e.g., a dynamic portion), and a third portion (e.g., a second static portion). The first portion 124 of the flexible heat spreader 102 is physically attached to a component supported by the housing 104 or the housing 104 itself. The third portion 128 of the flexible heat spreader 102 is physically attached to a portion of the display 116. For example, the first portion 124 of the flexible heat spreader 102 is physically attached to the PCB 111, and the third portion 128 of the flexible heat spreader 102 is physically attached to the display cover 122. In another example, the display cover 122 is made of plastic, and the third portion 128 of the flexible heat spreader 102 is physically attached to a sheet of thermally conductive material such as, for example, metal that is physically connected to the inner surface 120 of the display cover 122. More and/or different portions of the heat spreader 102 may be physically attached to more and/or different components within the computing device 100.

The flexible heat spreader 102 is physically attached to the PCB 111 and the display cover 122, for example, in any number of ways. In one example, the first portion 124 of the flexible heat spreader 102 is physically attached to the PCB 111, and the third portion 128 of the flexible heat spreader 102 is physically attached to the display cover 122 with an adhesive such as, for example, a thermal glue. In another example, the flexible heat spreader 102 is physically attached to the PCB 111 and/or the display cover 122 with connectors (e.g., nut/bolt combinations, screws, threaded bosses, tabs, flanges, and/or other connectors).

Some of the power dissipated as heat at the PCB 111 (e.g., by the processor 106), for example, is conducted through the PCB 111, into and through the first portion 124 of the flexible heat spreader 102, through the second portion 126 of the heat spreader, through and out of the third portion 128 of the flexible heat spreader 102, and into the display cover 122, for example, of the display 116. The transferred heat is spread out over the display cover 122 via conduction.

The second portion 126 of the heat spreader 102 is configured differently than the first portion 124 and the third portion 128 of the heat spreader 102 so as to allow bending of the second portion 126 of the heat spreader 102 as the display 116 rotates (e.g., opens and closes) relative to the housing 104 of the computing device 100.

Figure 2:
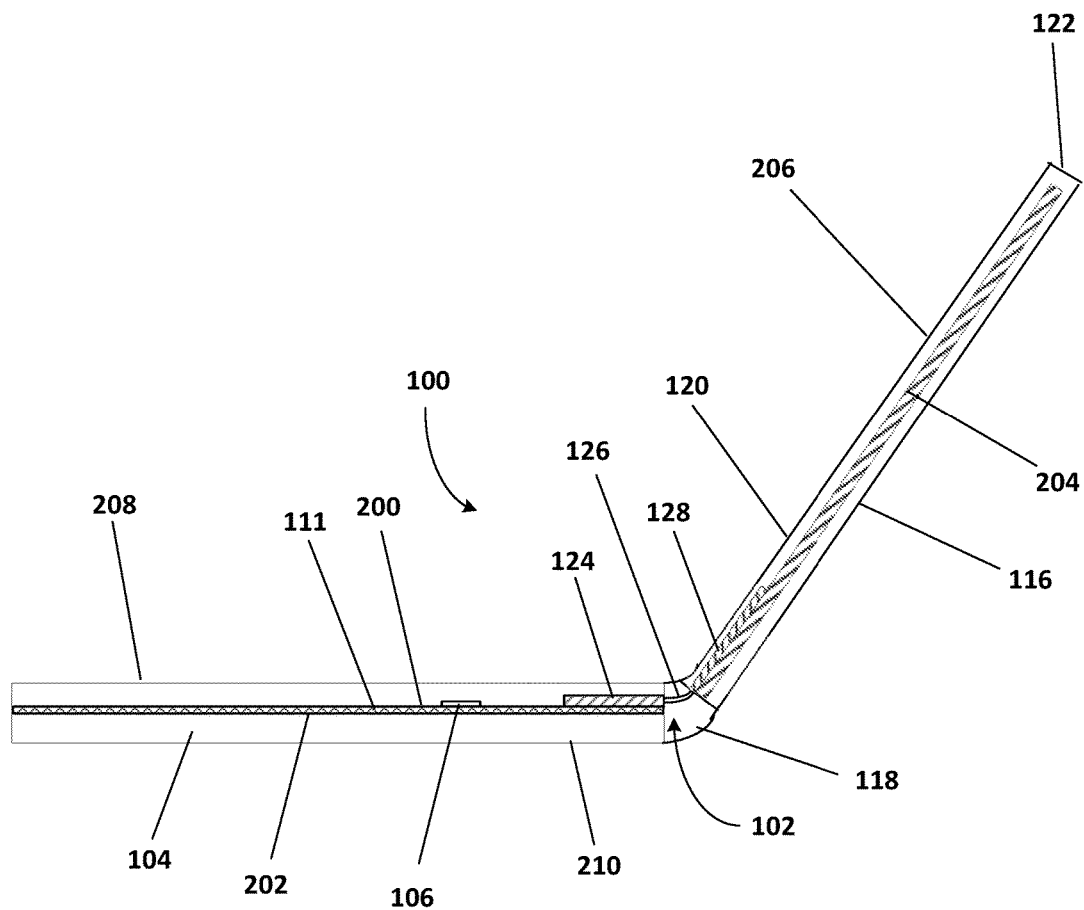
FIG. 2 depicts a cross-sectional side view of a computing device in an open configuration.

FIG. 2 depicts a cross-sectional side view of the computing device 100 or another computing device in an open configuration. The computing device 100, for example, includes the housing 104 and the display 116. The display 116 is rotatably attached to the housing 104 via the one or more hinges 118.

The first portion 124 of the heat spreader 102 is physically attached to a first side 200 of the PCB 111. The first side 200 of the PCB 111 also supports the processor 106. In other examples, the first portion 124 of the heat spreader 102 may be physically attached to a second side 202 of the PCB 111 opposite the first side 200, and/or the processor 106 may be supported by the second side 202 of the PCB 111. The first portion 124 of the heat spreader 102 is physically attached to the PCB 111 in any number of ways including, for example, with an adhesive (e.g., a thermal glue). The third portion 128 of the heat spreader 102 is physically attached to the inner surface 120 of the display cover 122 and/or another portion of the display 116 (e.g., a portion of a display assembly 204). The third portion 128 of the heat spreader 102 is physically attached to the display 116 in any number of ways including, for example, with an adhesive (e.g., a thermal glue). The second portion 126 of the heat spreader 102 extends between the first portion 124 of the heat spreader 102 and the third portion 126 of the heat spreader 102.

The display 116 is rotatable relative to the housing 104 via the one or more hinges 118 from a first rotational position relative to the housing (e.g., the open configuration shown in FIG. 2; a position in which an outer surface 206 of the display 116 is at an angle of 60 degrees or more relative to a top 208 of the housing 104) to a second rotational position relative to the housing 104 (e.g., a closed configuration; a position in which the surface 206 of the display 116 is at an angle of less than 60 degrees relative to the top 208 of the housing 104, or is parallel to the top 208 of the housing 104). The display 116 may be rotated relative to the housing 104 and/or the housing 104 may be rotated relative to the display 116 into different and/or additional positions. For example, the display 116 may rotate from the second rotational position relative to the housing 104 (e.g., with the display 116 adjacent to the top 208 of the housing 104) 360 degrees to a third rotational position relative to the housing 104 (e.g., with the display 116 adjacent to a bottom 210 of the housing 104).

The second portion 124 (e.g., the dynamic portion) of the heat spreader 102 is to withstand this opening and closing of the display 116 relative to the housing 104. For example, the dynamic portion 124 of the heat spreader 102 may have fatigue strength to last tens of thousands of cycles of the display 116 opening and closing. The dynamic portion 124 of the heat spreader 102 is thinner than the first portion 122 of the heat spreader 102 (e.g., the first static portion) and the third portion 126 of the heat spreader 102 (e.g., the second static portion) to help prevent failure of the heat spreader 102 at the dynamic portion 124 of the heat spreader 102 prior to reaching the tens of thousands of cycles. For example, the heat spreader 102 may be made of one or more layers of a flexible thermally conductive material such as Graphite.

Figure 3:
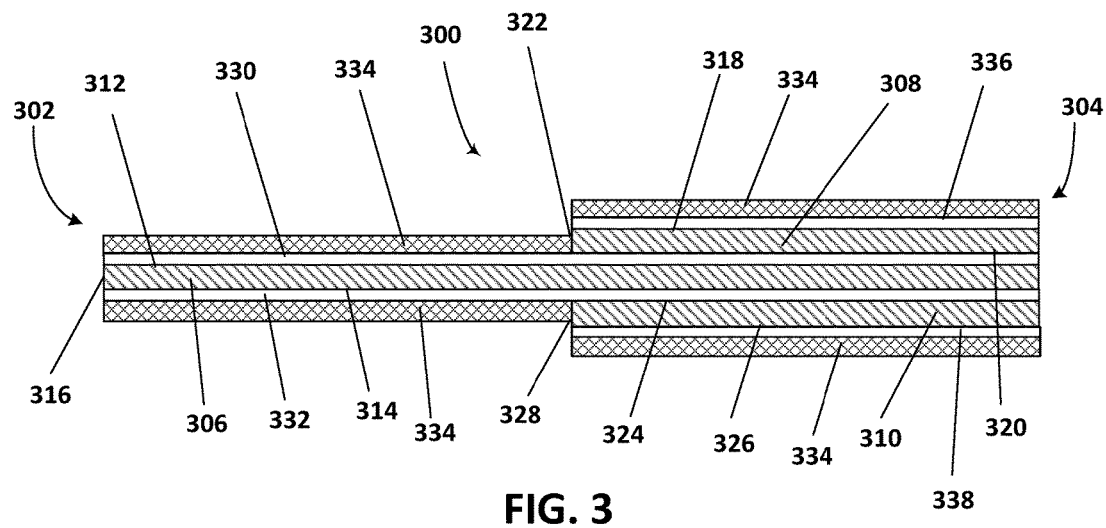
FIG. 3 depicts a cross-sectional view of one example of a flexible heat spreader.

FIG. 3 shows a cross-sectional view of one example of a flexible heat spreader 300. The flexible heat spreader 300 includes a first portion 302 (e.g., a dynamic portion) and a second portion 304 (e.g., a static portion). A first part of the first portion 302 may be physically connected (e.g., adhered) to a portion of a display or a chassis of a computing device, and a second part of the first portion 302 may extend through a hinge rotatably attaching the display to the chassis of the computing device. The second portion 304 may be physically connected (e.g., adhered) to the chassis or the display.

The flexible heat spreader 300 includes at least a layer of a first material 306, a first layer of a second material 308, and a second layer of the second material 310. The layer of the first material 306 is included in the first portion 302 and the second portion 304 of the flexible heat spreader 300. In other words, the layer of the first material 306 extends across the entire flexible heat spreader 300. The layer of the first material 306 includes a first side 312, a second side 314 opposite the first side 312, and a third side 316 extending between the first side 312 and the second side 314.

The first layer of the second material 308 and the second layer of the second material 310 are included in the second portion 304 of the flexible heat spreader 300. The first layer of the second material 308 includes a first side 318, a second side 320 opposite the first side 318, and a third side 322 extending between the first side 318 and the second side 320. The second layer of the second material 310 includes a first side 324, a second side 326 opposite the first side 324, and a third side 328 extending between the first side 324 and the second side 326.

The layer of the first material 306, the first layer of the second material 308, and the second layer of the second material 310 may be made of any number of thermally conductive materials. For example, the first material and the second material may both be graphite-based materials (e.g., synthetic graphite). The first material and the second material may be a same material. Alternatively, the first material and the second material may be different materials. For example, the first material may be a graphite-based material with greater flexibility than the second material, and the second material may be a graphite-based material with a greater thermal conductivity than the first material. In another example, the layer of the first material 306, the first layer of the second material 308, and the second layer of the second material 310 are all made of different materials.

The second side 320 of the first layer of the second material 308 is physically connected to the first side 312 of the layer of the first material 306 in any number of ways. For example, the second side 320 of the first layer of the second material 308 is physically connected to the first side 312 of layer of the first material 306 via a first layer of adhesive 330. The first layer of adhesive 330 may be applied to all or less than all of the first side 312 of the layer of the first material 306. The first layer of adhesive 330 may be, for example, a thermal glue.

The first side 324 of the second layer of the second material 310 is physically connected to the second side 314 of the layer of the first material 306 in any number of ways. For example, the first side 324 of the second layer of the second material 310 is physically connected to the second side 314 of layer of the first material 306 via a second layer of adhesive 332. The second layer of adhesive 332 may be applied to all or less than all of the second side 314 of the layer of the first material 306. The second layer of adhesive 332 may be, for example, a thermal glue.

The first layer of the second material 308 and the second layer of the second material 310 may be physically connected to the layer of the first material 306 in other ways including, for example, with connectors. In one example, the first layer of the second material 308, the second layer of the second material 310, and the layer of the first material 306 are formed as a single continuous part.

In the example shown in FIG. 3, the flexible heat spreader 302 also includes layers of a third material 334 that cover portions of the layer of the first material 306, the first layer of the second material 308, and the second layer of the second material 310, respectively. The layers of the third material 334 may, for example, be made of an electrical insulator such as Mylar. Other materials (e.g., electrical insulators) may be used for the layers of the third material 334. The layers of Mylar 334, for example, prevent electrical contact between the flexible heat spreader 300 and active parts of the computing device.

In the example shown in FIG. 3, layers of Mylar 334 are disposed on the first side 312 and the second side 314 of the layer of the first material 306 within the first portion 302 of the flexible heat spreader 300, respectively. Layers of Mylar 334 are also disposed on the first side 318 of the first layer of the second material 308 and the second side 326 of the second layer of the second material 308, respectively.

Layers of Mylar 334, for example, may be physically connected to the layer of first material 306 within the first portion 302 of the flexible heat spreader 300 via the first layer of adhesive 330 and the second layer of adhesive 332, respectively. For example, the first layer of adhesive 330 may cover the entire first side 312 of the layer of the first material 306, and the second layer of adhesive 332 may cover the entire second side 314 of the layer of the first material 306.

Layers of Mylar 334, for example, may be physically connected to the first side 318 of the first layer of the second material 308 and the second side 326 of the second layer of the second material 308 with a third layer of adhesive 336 and a fourth layer of adhesive 338, respectively. The third layer of adhesive 336 and the fourth layer of adhesive 338 may be same or different adhesives as the first layer of adhesive 332 and the second layer of adhesive 334 (e.g., the thermal glue). Alternatively, the third layer of adhesive 336 and/or the fourth layer of adhesive 338 may be different than the first layer of adhesive 332 and/or the second layer of adhesive 334.

The different components of the flexible heat spreader 300 may be any number of sizes. The amount of heat that can be transferred from the chassis to the display, for example, depends on the thermal resistance of the material or the materials (e.g., flexible synthetic graphite) used within the flexible heat spreader 300. The thermal resistance of the graphite, for example, depends on thickness of graphite, with thicker graphite providing better heat transfer. For fatigue life of the dynamic portion 302 (e.g., the first portion) of the flexible heat spreader 300, thinner is better. Accordingly, the dynamic portion 302 of the flexible heat spreader 300 is thinner than the static portion 304 of the flexible heat spreader 300 to provide a sufficient fatigue life for the flexible heat spreader 300. Since strain is not generated within most of the static portion 304 of the flexible heat spreader 300 during rotation of the display relative to the chassis, the thickness of the flexible heat spreader 300 may be built up within the static portion 304. The first layer of the second material 308 and the second layer of the second material 310 are thus physically attached to the layer of the first material 302 within the static portion 304 to improve heat transfer at the static portion 304.

For example, the layer of the first material 306 may be 25-100 μm thick. The first layer of the second material 308 and the second layer of the second material 310 may be 100 μm or greater thick. The first layer of adhesive 332, the second layer of adhesive 334, and the third layer of adhesive 336 may be 25-50 μm thick. The layers of Mylar 334, for example, may be 25-50 μm thick. In other examples, the layer of the first material 306, the first layer of the second material 308, the second layer of the second material 310, the first layer of adhesive 332, the second layer of adhesive 334, the third layer of adhesive 336, and/or at least one of the layers of Mylar 334 is thinner, thicker, and/or has a thickness that varies across the respective component.

The components of the flexible heat spreader 300 may be sized such that the flexible heat spreader 300 is symmetric about a centerline through the flexible heat spreader 300. In other words, corresponding components of the flexible heat spreader 300 have equal thicknesses above and below the layer of the first material 306 within the dynamic portion 302 and the static portion 304, respectively. For example, the first layer of the second material 308 has a same thickness as the second layer of the second material 310. This symmetry helps lower strains experienced by the layer of the first material 306 within the dynamic portion 302 of the flexible heat spreader 300 during rotation of the display relative to the chassis. In other words, by positioning the layer of the first material 306 in the middle of the flexible heat spreader 300 in a direction of the thickness of the flexible heat spreader 300, strains within the layer of the first material 306 in the dynamic portion 302 are reduced during bending.

Figure 4:
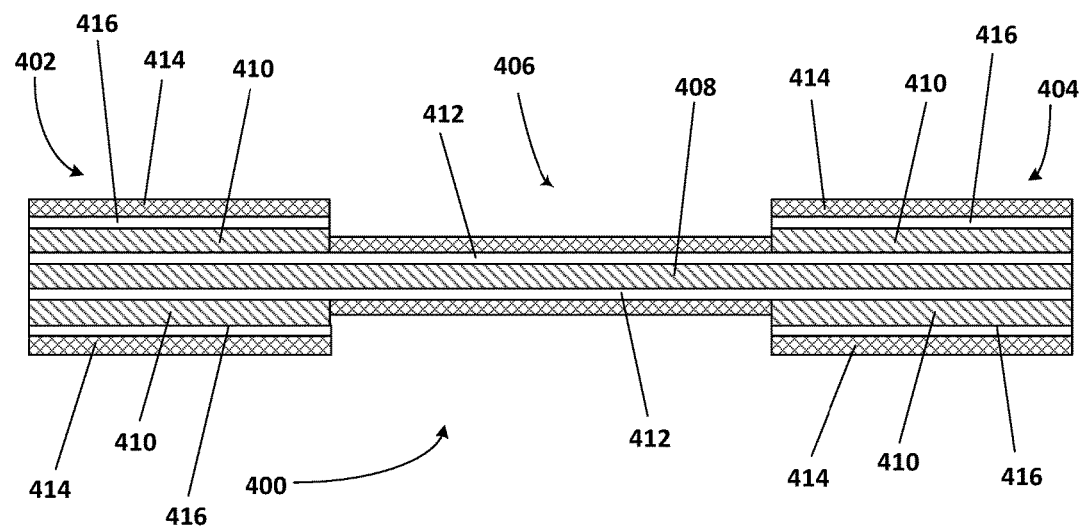
FIG. 4 depicts a cross-sectional view of another example of a flexible heat spreader.

FIG. 4 shows a cross-sectional view of another example of a flexible heat spreader 400. The flexible heat spreader 400 has a similar structure to the flexible heat spreader 300 shown in FIG. 3 other than the flexible heat spreader 400 including two static portions instead of one. In other examples, the flexible heat spreader 400 includes more than two static portions and more than one dynamic portion. For example, the flexible heat spreader may include an additional static portion physically attached to a portion of the hinge that does not rotate relative to the chassis, and dynamic portions between the additional static portion and the chassis and the display, respectively.

The flexible heat spreader 400 includes a first portion 402 (e.g., a first static portion), a second portion 404 (e.g., a second static portion), and a third portion 406 (e.g., a dynamic portion) extending between the first portion 402 and the second portion 404. The first portion 402 is physically attached to a portion of a chassis of a computing device (e.g., a PCB supported by the chassis), and the second portion 404 is physically attached to a portion of a display rotatably attached to the chassis. At part of the third portion 406 may extend through a hinge (e.g., a hinge cover). In one example, at least part of the third portion 406 is physically attached (e.g., adhered) to the chassis and/or the display of the computing device.

A layer of a first material 408 is included in the first portion 402, the second portion 404, and the third portion 406. The first portion 402 and the second portion 404 (e.g., the first static portion and the second static portion) are each built up with layers of a second material 410. The second material may be the same or different than the first material. For example, layers of the second material 410 are physically attached to opposite sides of the layer of the first material 408 with, for example, layers of adhesive 412.

Outer portions of the flexible heat spreader 400 may be covered with layers of an electrical insulator 414. The layers of the electrical insulator 414 may be made of, for example, Mylar. For example, layers of Mylar 414 may be physically attached to outer surfaces of the layers of second material 410 with, for example, additional layers of adhesive 416. Layers of Mylar 414 may also be physically attached to opposite sides of the layer of the first material 408 with, for example, the layers of adhesive 412. Other configurations may be provided.

Figure 5:
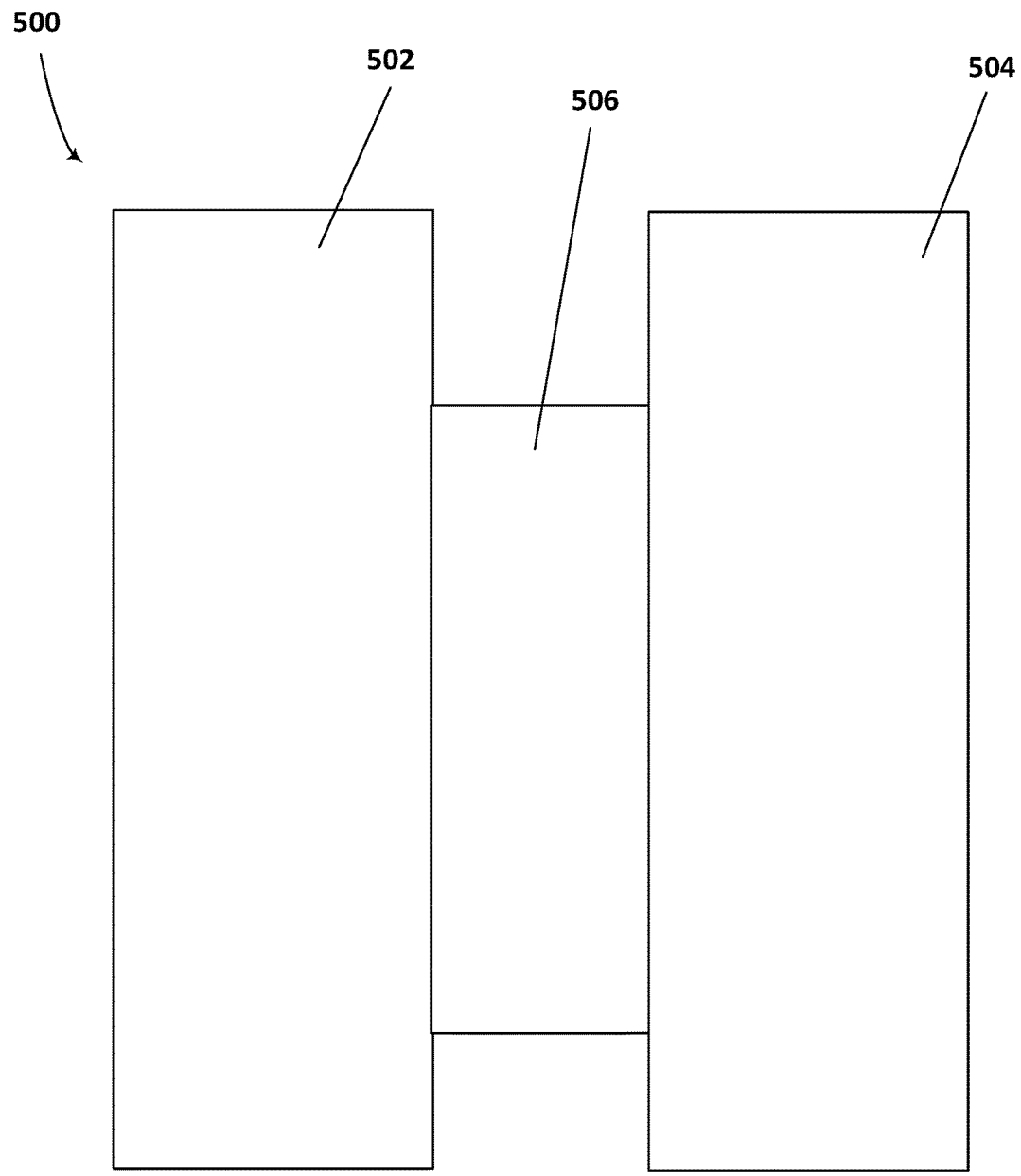
FIG. 5 depicts a top view of yet another example of a flexible heat spreader.

While the thickness of the flexible heat spreader 400, for example, may vary across the first portion 402, the second portion 404, and the third portion, the length and the width of the flexible heat spreader 400 may be constant (see FIG. 1). In one example, however, the length (e.g., in a direction extending across the first portion 502, the second portion 504, and the third portion) and/or the width (e.g., in a direction perpendicular to the length and the thickness) of a flexible heat spreader may also vary. FIG. 5 shows a top view of yet another example of a flexible heat spreader 500. The flexible heat spreader 500 includes a first portion 502 (e.g., a first static portion), a second portion 504 (e.g., a second static portion), and a third portion 506 (e.g., a dynamic portion) that extends between the first portion 502 and the second portion 504. The first portion 502 may be physically attached to a portion of a chassis (e.g., a PCB supported by the chassis), and the second portion 504 may be physically attached to a portion of a display rotatably attached to the chassis. In the example shown in FIG. 5, the width of the flexible heat spreader 500 varies in that the first portion 502 and the second portion 504 have a greater width than the third portion 506. In one example, the width of the first portion 502 is equal to the width of the second portion 504. In other examples, the first portion 502, the second portion 504, and the third portion 506 all have different widths and/or lengths. Other configurations may be provided. For example, at least two of the first portion 502, the second portion 504, and the third portion 506 have different lengths.

Figure 6:
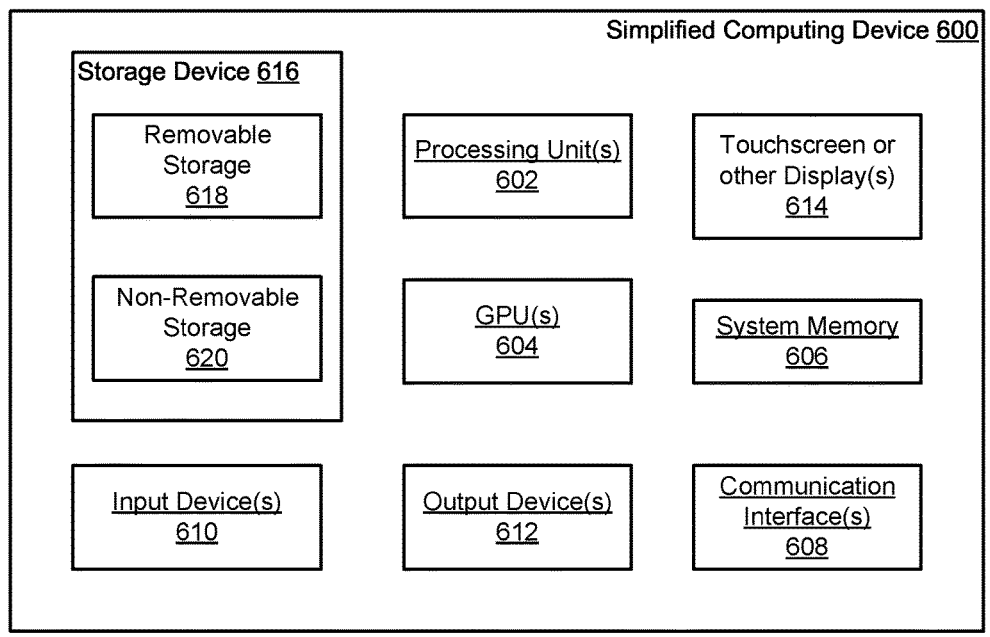
FIG. 6 is a block diagram of a computing environment in accordance with one example for implementation of the disclosed methods or one or more electronic devices.

With reference to FIG. 6, a thermal management system, as described above, may be incorporated within an exemplary computing environment 600. The computing environment 600 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. For example, the heat dissipating apparatus is incorporated within a computing environment having an active cooling source (e.g., fans).

The computing environment 600 has sufficient computational capability and system memory to enable basic computational operations. In this example, the computing environment 600 includes one or more processing units 602, which may be individually or collectively referred to herein as a processor. The computing environment 600 may also include one or more graphics processing units (GPUs) 604. The processor 602 and/or the GPU 604 may include integrated memory and/or be in communication with system memory 606. The processor 602 and/or the GPU 604 may be a specialized microprocessor, such as a digital signal processor (DSP), a very long instruction word (VLIW) processor, or other microcontroller, or may be a general purpose central processing unit (CPU) having one or more processing cores. The processor 602, the GPU 604, the system memory 606, and/or any other components of the computing environment 600 may be packaged or otherwise integrated as a system on a chip (SoC), application-specific integrated circuit (ASIC), or other integrated circuit or system.

The computing environment 600 may also include other components, such as, for example, a communications interface 608. One or more computer input devices 610 (e.g., pointing devices, keyboards, audio input devices, video input devices, haptic input devices, or devices for receiving wired or wireless data transmissions) may be provided. The input devices 610 may include one or more touch-sensitive surfaces, such as track pads. Various output devices 612, including touchscreen or touch-sensitive display(s) 614, may also be provided. The output devices 612 may include a variety of different audio output devices, video output devices, and/or devices for transmitting wired or wireless data transmissions.

The computing environment 600 may also include a variety of computer readable media for storage of information such as computer-readable or computer-executable instructions, data structures, program modules, or other data. Computer readable media may be any available media accessible via storage devices 616 and includes both volatile and nonvolatile media, whether in removable storage 618 and/or non-removable storage 620. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by the processing units of the computing environment 600.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a thermal management device for a computing device is provided. The thermal management device includes a layer of a first material included in a dynamic portion of the thermal management device and a static portion of the thermal management device. The dynamic portion of the thermal management device is bendable relative to the static portion of the thermal management device when the thermal management device is physically connected to a display and a chassis of the computing device, and the display rotates relative to the chassis. The layer of the first material has a first side and a second side. The second side is opposite the first side. The thermal management device also includes a first layer of a second material and a second layer of the second material physically connected to the first side and the second side of the static portion of the layer of the first material, respectively.

In a second embodiment, with reference to the first embodiment, the first layer of the second material and the second layer of the second material are physically connected to the first side and the second side of the layer of the first material with layers of adhesive, respectively.

In a third embodiment, with reference to the first embodiment, the first material and the second material are a same material.

In a fourth embodiment, with reference to the third embodiment, the same material is graphite.

In a fifth embodiment, with reference to the first embodiment, the thermal management device further includes a first layer of a third material and a second layer of the third material physically connected to the first side and the second side of the layer of the first material, respectively, within the dynamic portion of the thermal management device. The third material is different than the first material and the second material.

In a sixth embodiment, with reference to the fifth embodiment, the thermal management device further includes a first layer of a fourth material and a second layer of the fourth material physically connected to the first layer of the second material and the second layer of the second material, respectively. The fourth material is different than the first material and the second material.

In a seventh embodiment, with reference to the sixth embodiment, the third material and the fourth material are a same material.

In an eighth embodiment, with reference to the fifth embodiment, the first layer of the second material and the second layer of the second material have a same thickness.

In a ninth embodiment, with reference to the first embodiment, the static portion is a first static portion, and the layer of the first material is also included in a second static portion of the thermal management device. The dynamic portion is between the first static portion and the second static portion.

In a tenth embodiment, with reference to the ninth embodiment, the second material and the third material are a same material.

In an eleventh embodiment, a computing device includes a chassis supporting a printed circuit board (PCB). The PCB supports a heat generating device. The computing device also includes a display rotatably connected to the chassis, and a flexible heat spreader. The flexible heat spreader includes a layer of a first material. The layer of the first material has a first side and a second side. The first side is opposite the second side. The layer of the first material has a first portion, a second portion, and a third portion. The third portion extends between the first portion and the second portion. The flexible heat spreader also includes a first layer of a second material and a second layer of the second material physically connected to the first side and the second side of the first portion of the layer of the first material, respectively. The flexible heat spreader also includes a first layer of a third material and a second layer of the third material physically connected to the first side and the second side of the second portion of the layer of the first material, respectively. The second layer of the second material is physically connected and adjacent to a portion of the display, and the second layer of the third material is physically connected and adjacent to the PCB.

In a twelfth embodiment, with reference to the eleventh embodiment, the third portion of the layer of the first material extends through the hinge.

In a thirteenth embodiment, with reference to the eleventh embodiment, the first material, the second material, and the third material are a same material. The same material is graphite.

In a fourteenth embodiment, with reference to the eleventh embodiment, the first layer of the second material and the second layer of the second material have a same first thickness. The first layer of the third material and the second layer of the second material have a same second thickness.

In a fifteenth embodiment, with reference to the eleventh embodiment, the computing device further includes a first layer of a fourth material physically connected to the first layer of the second material, a second layer of the fourth material physically connected to the second layer of the second material, and a third layer of the fourth material physically connected to the second layer of the third material. The computing device further includes a fourth layer of the fourth material physically connected to the second layer of the third material, a fifth layer of the fourth material physically connected to the first side of the third portion of the layer of the first material, and a sixth layer of the fourth material physically connected to the second side of the third portion of the layer of the first material.

In a sixteenth embodiment, with reference to the fifteenth embodiment, the fourth material is Mylar.

In a seventeenth embodiment, a thermal management device includes a heat spreader having a first side, a second side, a first portion, and a second portion. The second side is opposite the first side. The thermal management device also includes a first layer of a first material physically connected to the first side of the first portion of the heat spreader, and a second layer of the first material physically connected to the second side of the first portion of the heat spreader. The first layer of the first material and the second layer of the first material have a same thickness.

In an eighteenth embodiment, with reference to the seventeenth embodiment, the heat spreader is a layer of graphite.

In a nineteenth embodiment, with reference to the seventeenth embodiment, the heat spreader includes a phase change device.

In a twentieth embodiment, with reference to the seventeenth embodiment, the first layer of the first material is adhered to the first side of the first portion of the heat spreader, and the second layer of the first material is adhered to the second side of the first portion of the heat spreader. The thermal management device further includes a first layer of a second material physically attached to the first layer of the first material, and a second layer of the second material physically attached to the second layer of the first material. The thermal management device further includes a third layer of the third material physically attached to the first side of the second portion of the heat spreader, and a fourth layer of the third material physically attached to the second side of the second portion of the heat spreader.

In connection with any one of the aforementioned embodiments, the thermal management device or the method for manufacturing the thermal management device may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A thermal management device for a computing device, the thermal management device comprising;
   a layer of a first material included in a dynamic portion of the thermal management device and a plurality of static portions of the thermal management device, wherein the plurality of static portions and the dynamic portion are sheets, the dynamic portion of the thermal management device being bendable relative to the plurality of static portions of the thermal management device when a first static portion of the thermal management device is physically connected to a display and a second static portion of the thermal management device is physically connected to a chassis of the computing device, and the display rotates relative to the chassis, the layer of the first material having a first side and a second side, the second side being opposite the first side, wherein the dynamic portion is between the first static portion and the second static portion of the plurality of static portions;
a first layer of a second material and a second layer of the second material physically connected to the first side and the second side of a first static portion of the plurality of static portions of the layer of the first material, respectively, wherein the second material is only positioned in the plurality of static and the plurality of static portions of the thermal management device are thicker than the dynamic portion of the thermal management device; and
a first layer of a third material and a second layer of the third material physically connected to the first layer of the second material and the second layer of the second material, respectively, the third material being different than the first material and the second material.

2. The thermal management device of claim 1, wherein the first layer of the second material and the second layer of the second material are physically connected to the first side and the second side of the layer of the first material with layers of adhesive, respectively.

3. The thermal management device of claim 1, wherein the first material and the second material are a same material.

4. The thermal management device of claim 3, wherein the same material is graphite.

5. The thermal management device of claim 1, further comprising:
a first layer of a fourth material and a second layer of the fourth material physically connected to the first side and the second side of the layer of the first material, respectively, within the dynamic portion of the thermal management device,
wherein the fourth material is different than the first material and the second material.

6. The thermal management device of claim 5, wherein the third material and the fourth material are a same material.

7. The thermal management device of claim 5, wherein the first layer of the second material and the second layer of the second material have a same thickness.

8. The thermal management device of claim 1, wherein the first layer of the third material and the second layer of the third material are physically connected to the first side and the second side of the layer of the first material, respectively, within a second static portion of the thermal management device.

9. The thermal management device of claim 1, wherein the layer of the first material and first layer of the second material and the second layer of the second material are formed as a single continuous part.

10. A computing device comprising:
a chassis supporting a printed circuit board (PCB), the PCB supporting a heat generating electric device;
a display rotatably connected to the chassis; and
a flexible heat spreader having a first static portion, a second static portion, and a dynamic portion extending between the first static portion and the second static portion, the flexible heat spreader comprising:
a layer of a first material, wherein the layer of the first material has a first side and a second side, the first side being opposite the second side, and wherein the layer of the first material has a first portion included within the first static portion of the flexible heat spreader, a second portion included within the second static portion of the flexible heat spreader, and a third portion included within the dynamic portion of the flexible heat spreader, the third portion of the layer of the first material extending between the first portion of the layer of the first material and the second portion of the layer of the first material;
a first layer of a second material and a second layer of the second material physically connected to the first side and the second side of the first portion of the layer of the first material, respectively;
a first layer of a third material and a second layer of the third material physically connected to the first side and the second side of the second portion of the layer of the first material, respectively; and
a first layer of a fourth material physically connected to the first layer of the second material, a second layer of the fourth material physically connected to the second layer of the second material, a third layer of the fourth material physically connected to the first layer of the third material, a fourth layer of the fourth material physically connected to the second layer of the third material;
a fifth layer of the fourth material physically connected to the first side of the third portion of the layer of the first material and a sixth layer of the fourth material physically connected to the second side of the third portion of the layer of the first material,
wherein the second layer of the second material is physically connected and adjacent to a portion of the display, and the second layer of the third material is physically connected and adjacent to the PCB, the first static portion of the flexible heat spreader being static relative to the portion of the display and the second static portion of the flexible heat spreader being static relative to the PCB.

11. The computing device of claim 10, further comprising a hinge, wherein the third portion of the layer of the first material extends through the hinge.

12. The computing device of claim 10, wherein the first material, the second material, and the third material are a same material, the same material being graphite.

13. The computing device of claim 10, wherein the first layer of the second material and the second layer of the second material have a same first thickness, and
wherein the first layer of the third material and the second layer of the second material have a same second thickness.

14. The computing device of claim 10, wherein the fourth material is Mylar.

15. A thermal management device having a plurality of static portions and a dynamic portion in a plane with the plurality of static portions, the dynamic portion being positioned between the plurality of static portions in the plane of the thermal management device, the dynamic portion of the thermal management device being bendable relative to the plurality of static portions of the thermal management device when the thermal management device is physically connected to a display and a chassis of a computing device, and the display rotates relative to the chassis, the thermal management device comprising:
- a heat spreader having a first side, a second side, a first portion included within a first static portion of the plurality of static portions of the thermal management device, a second portion included within a second static portion of the plurality of static portions; and a third portion included within the dynamic portion of the thermal management device, the second side being opposite the first side, the third portion being located between the first portion and the second portion, wherein the plurality of static portions and the dynamic portion are sheets;
- a first layer of a first material physically connected to the first side of the first portion of the heat spreader; and a second layer of the first material physically connected to the second side of the first portion of the heat spreader wherein the first material is not positioned in the dynamic portion of the thermal management device; and
- a first layer of a second material physically connected to the first layer of the first material, and a second layer of the second material physically connected to the second layer of the first material,
- wherein the first layer of the first material and the second layer of the first material have a same thickness, and
- wherein the first static portion of the thermal management device is thicker through the first static portion than through the dynamic portion of the thermal management device.

16. The thermal management device of claim 15, wherein the heat spreader is a layer of graphite.

17. The thermal management device of claim 15, wherein the heat spreader comprises a phase change device.

18. The thermal management device of claim 15, wherein the first layer of the first material is adhered to the first side of the first portion of the heat spreader, and the second layer of the first material is adhered to the second side of the first portion of the heat spreader,
  wherein the thermal management device further comprises:
    a third layer of the second material physically attached to the first side of the third portion of the heat spreader; and
    a fourth layer of the second material physically attached to the second side of the third portion of the heat spreader.

19. The thermal management device of claim 15, wherein the static portion and the dynamic portion have the same width.

* * * * *